United States Patent [19]

Hayashi

[11] Patent Number: 5,242,844

[45] Date of Patent: Sep. 7, 1993

[54] SEMICONDUCTOR DEVICE WITH POLYCRYSTALLINE SILICON ACTIVE REGION AND METHOD OF FABRICATION THEREOF

[75] Inventor: Hisao Hayashi, Kanagawa, Japan

[73] Assignee: Sony Corporation, Japan

[21] Appl. No.: 643,504

[22] Filed: Jan. 22, 1991

Related U.S. Application Data

[63] Continuation of Ser. No. 97,341, Sep. 11, 1987, Pat. No. 5,172,203, which is a continuation of Ser. No. 683,860, Dec. 20, 1984, abandoned.

[30] Foreign Application Priority Data

Dec. 23, 1983 [JP] Japan .................. 58-251813
May 24, 1984 [JP] Japan .................. 59-105192

[51] Int. Cl.⁵ .......................... H01L 21/265
[52] U.S. Cl. ........................ 437/40; 437/29; 437/41; 437/46; 437/34
[58] Field of Search .......... 437/40, 41, 46, 29, 437/968, 967, 34, 21, 57; 148/DIG. 116, DIG. 117; 357/23.7, 59 E

[56] References Cited

U.S. PATENT DOCUMENTS

| | | | |
|---|---|---|---|
| 3,258,663 | 6/1966 | Weimer | 357/23.7 |
| 3,290,569 | 12/1966 | Weimer | 357/23.7 |
| 3,304,469 | 2/1967 | Weimer | 357/59 E |
| 3,514,676 | 5/1970 | Fa | 357/59 E |
| 4,124,934 | 11/1978 | De Brebisson | 437/968 |
| 4,212,684 | 7/1980 | Brower | 437/21 |
| 4,231,819 | 11/1980 | Raffel et al. | 437/968 |
| 4,263,709 | 4/4981 | Weitzel et al. | 437/968 |
| 4,409,724 | 10/1983 | Tasch, Jr. et al. | 437/46 |
| 4,420,870 | 12/1983 | Kimura | 437/46 |
| 4,479,297 | 10/1984 | Mizutani et al. | 437/21 |
| 4,545,113 | 10/1985 | Vora | 437/21 |
| 4,777,147 | 10/1988 | Scott et al. | 437/57 |

Primary Examiner—Brian E. Hearn
Assistant Examiner—Kevin M. Picardat
Attorney, Agent, or Firm—Ronald P. Kananen

[57] ABSTRACT

A polycrystalline silicon layer is used to allow simultaneous fabrication of both N- and P-type MOSFET's on a common channel layer during integrated circuit fabrication. The polysilicon layer is between 20Å and 750Å thick, and preferably between 200Å and 500Å thick. These dimensions afford the polysilicon layer the high effective mobility, low threshold voltage and low leakage current characteristics, especially if the vapor-deposited polysilicon layer is annealed and/or ion implanted with Si+ or Ge+ after deposition. Application of the polysilicon layer over adjoining insulating and P-type semiconducting areas allows the single polysilicon layer to serve as active terminals and channels of both conductivity types of MOS transistors without intervening insulating or semiconducting layers. Deposition of the polysilicon layer in direct contact with a single-crystal substrate enhances the beneficial electrical properties of the polysilicon layer, especially if the polysilicon layer is annealed following deposition.

20 Claims, 3 Drawing Sheets

SEMICONDUCTOR DEVICE WITH POLYCRYSTALLINE SILICON ACTIVE REGION AND METHOD OF FABRICATION THEREOF

This application is a continuation of application Ser. No. 07/097,341, filed Sep. 11, 1987, now U.S. Pat. No. 5,172,203, which is a continuation of application Ser. No. 06/683,860, filed on Dec. 20, 1984, now abandoned.

BACKGROUND OF THE INVENTION

The present invention relates generally to a semiconductor device, such as a field-effect transistor (FET) suitable for production as a MOS thin-film transistor (MOS TFT). More particularly, the invention relates to a semiconductor device having a polycrystalline silicon layer acting as an active region with high effective mobility, relatively low threshold voltage, and low leakage current between the source region and the drain region when used in MOS TFT.

It has been known that semiconductor devices with polycrystalline silicon active regions formed by chemical vapor deposition processes and the like are less efficient than semiconductor devices with single-crystal silicon active regions due to relatively low effective mobility, relatively high threshold c voltage, and relatively high leakage current while the MOS TFT is turned OFF. This is believed to be due to the characteristics of the polycrystalline silicon layer serving as the active region.

The inventors have found that the effective mobility $\mu_{eff}$ of the polycrystalline silicon film is significantly enhanced within a specific thickness range. Specifically, when the thickness of the polycrystalline silicon film is held to within a specific range thinner than that conventionally employed in semiconductor devices, its effective mobility becomes much higher than typically expected. This fact has not been exploited before because it has generally been believed that the effective mobility of a thin polysilicon film is almost independent of thickness in films thinner than 1500Å. The results of experiments by the inventor indicate that effective mobility becomes much greater than conventionally assumed in a range of thickness far thinner than is used conventionally.

The inventor has also found that if the effective mobility of the polycrystalline silicon film is sufficiently great, a thin film of polycrystalline silicon can be used to simplify the geometry and fabrication of complementary MOS (C-MOS) integrated circuits and so facilitate, for example, the fabrication of high-density C-MOS inverters.

SUMMARY OF THE INVENTION

Therefore, it is an object of the present invention to provide a semiconductor device with a thin polycrystalline silicon film serving as an active region which has an effective mobility matching that of single-crystal silicon.

Another and more specific object of the present invention is to provide a semiconductor device having an active region made of polycrystalline silicon film of a specific thickness, specifically significantly thinner than conventional devices.

A further object of the invention is to provide a high-density C-MOS integrated inverter circuit employing a polycrystalline silicon thin film.

In order to accomplish the aforementioned and other objects, a semiconductor device, according to the present invention, is provided with a thin polycrystalline silicon film formed on a semiconducting or insulating substrate. The thickness of the film is adjusted so as to afford the film a relatively high effective mobility and low threshold voltage.

In the preferred embodiment, the thickness of the thin film falls in the range of approximately 100Å to 750Å. More preferably, the thickness of the thin film is in the range of approximately 100Å to 600Å. In the present invention, the effective mobility is optimized in the thickness range of 200Å to 500U.

The present invention also concerns a high-density C-MOS inverter IC employing the inventive polycrystalline silicon layer deposited on a semiconductor substrate over an insulating layer.

According to one aspect of the invention, a polycrystalline silicon layer to be deposited on a semiconductor substrate applicable to semiconductor devices, characterised in that the polycrystalline silicon layer serves as an active region of the semiconductor device and has a thickness in a specific thickness range in which the polycrystalline silicon layer exhibits a sufficiently high effective carrier mobility and a sufficiently low threshold voltage.

According to another aspect of the invention, a field effect transistor comprises a semiconductor substrate, a polycrystalline silicon active layer formed on the substrate, the active layer having a thickness in the range of 100Å to 750Å and forming therein a source region and a drain region, a gate electrode formed on the polycrystalline silicon layer over an insulating layer, and electrically conductive input/output terminals in contact with the source region and the drain region.

According to a further aspect of the invention, a process for fablicating a field effect transistor having a semiconductor substrate, a thin polycrystalline silicon film formed on the substrate, a gate electrode formed on the polycrystalline silicon film over an insulating layer, and input/output gates connected to a source region and a drain region formed in the polycrystalline silicon film, the process comprises the steps of:

depositing polycrystalline silicon on the substrate to a thickness in the range of 100Å to 750Å; and forming the gate electrode and input/output terminals subsequent to formation of the polycrystalline silicon film.

According to a still further aspect of the invention, an IC chip comprises a semiconductor substrate, an insulating layer formed on the substrate;

a polycrystalline silicon layer formed over the substrate and the insulating layer, a first semiconductor device of a first conductivity type formed on the polycrystalline silicon layer, and a second semiconductor device of a second, opposing conductivity type formed on the polycrystalline silicon layer.

According to a yet further aspect of the invention, a process for producing an IC chip including MOS transistors, comprises the steps of:

forming an insulating layer over a semiconducting substrate, the insulating layer leaving a section of the semiconductor substrate exposed; depositing a polycrystalline silicon layer over the insulating layer and the exposed section;

forming MOS transistors on the polycrystalline silicon layer over the insulating layer and the exposed section; and forming input/output terminals providing external connections to and from the MOS transistors and connecting electrodes which connect the MOS transistors to each other.

BRIEF DESCRIPTION OF THE DRAWINGS

The present invention will be understood more fully from the detailed description given herebelow and from the accompanying drawings of the preferred embodiments of the invention, which, however, should not be taken to limit the invention to the specific embodiments but are for explanation and understanding only.

In the drawings.

DESCRIPTION OF THE PREFERRED EMBODIMENT

Figure 1:
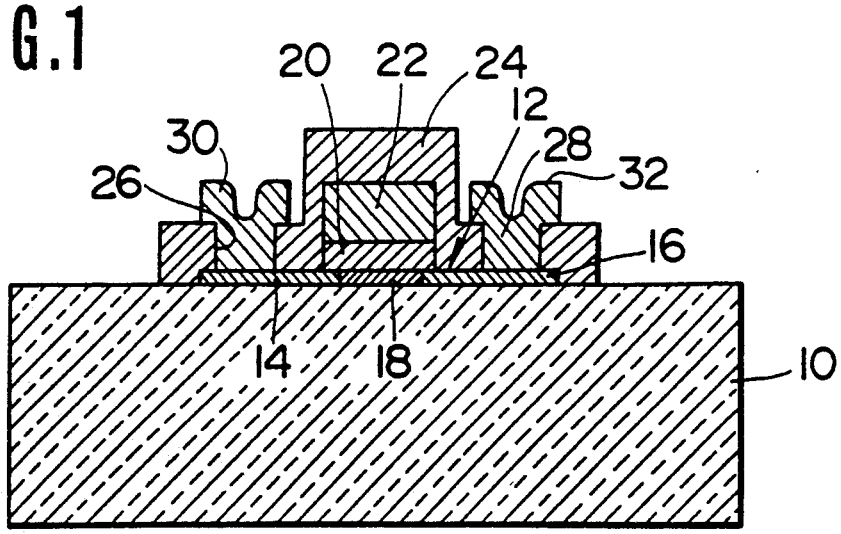
FIG. 1 is a cross-section of the preferred embodiment of a MOS TFT in accordance with the present invention.

Referring now to the drawings, FIG. 1 shows the preferred embodiment of a MOS thin film transistor which will be referred to hereafter as "MOS TFT". According to the invention, a thin polycrystalline silicon layer 12 is formed on a quartz substrate 10. The polycrystalline silicon layer 12 has n-type regions 14 and 16 at either end, where it is heavily doped with n-type impurities so as to have a relatively low resistance to electron conduction. The n-type regions 14 and 16 respectively form a source region and a drain region. The central section of the polycrystalline silicon layer defines a channel between the source region 14 and the drain region 16 and serves as an active region 18.

A gate insulating layer 20 made of silicon dioxide ($SiO_2$) is deposited on the polycrystalline silicon layer 12 so as to cover the active region 18. A highly doped polycrystalline silicon (DOPOS) gate electrode 22 is deposited over the gate insulator 20. The gate electrode 22 is covered with a silicon dioxide layer acting as an insulator 24. The insulator 24 is formed with openings 26 and 28 through which connector electrodes 30 and 32 are formed in contact with the source and drain regions 14 and 16 respectively. Although it not clearly illustrated in the drawing, the gate electrode 22 is also connected to a connector electrode fabricated in a per se well-known manner.

According to the preferred embodiment, the thickness t of the polycrystalline layer 12 is adjusted to be in the range of 100Å to 750Å, preferably about 200Å. This preferred thickness range has been derived empirically from experiments performed by the inventor with polycrystalline silicon layers of various thicknesses. The results of these experiments are illustrated in FIG. 2.

Figure 2:
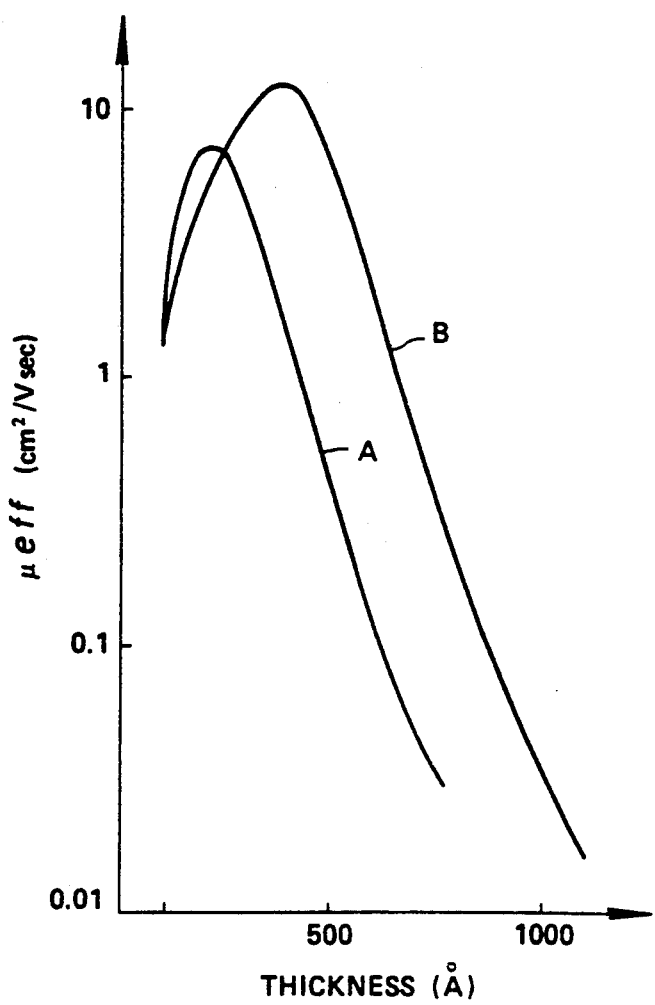
FIG. 2 is a graph of the relationship between effective mobility $\mu_{eff}$ and the thickness of the polycrystalline silicon film serving as the active region of the MOS TFT of FIG. 1.

As will be seen from FIG. 2, the effective mobility $\mu_{eff}$ of the polycrystalline silicon active region increases significantly as the thickness drops from about 1000Å to about 200–500Å. As the thickness of the polycrystalline silicon layer drops below 200Å, the mobility decreases at a relatively high rate. Also, as shown in FIG. 2, the effective mobility $\mu_{eff}$ of the polycrystalline silicon layer is maximized at a thickness of about 200–500Å.

In FIG. 2, curve A shows the behavior of the effective mobility of a polycrystalline silicon layer which is formed directly into the desired thickness by the process of chemical vapor deposition. On the other hand, curve B represents the characteristics of the effective mobility of a polycrystalline silicon layer which is first formed by chemical vapor deposition to a greater than desired thickness and then reduced to its final desired thickness by thermal oxidation. In experiments involving samples A, a maximum effective mobility of 7.2 $cm^2/V$ sec was achieved at a thickness of 210Å. On the other hand, experiments with samples B revealed a maximum effective mobility of 12 $cm^2/V$ sec at the thickness of 370Å.

In the shown embodiment, the thickness of the polycrystalline silicon active region is chosen to be 200Å, and so the effective mobility of an active region of type A will be about 7 $cm^2/V$ sec and in a circuit employing a layer of type B, about 5 $cm^2/V$ sec. Therefore, it should be appreciated that the mobility of the polycrystalline silicon layer according to the shown embodiment will be significantly higher than conventional polycrystalline silicon layers. Since the production costs of a polycrystalline silicon layer are much lower than for a single-crystal silicon layer, the overall production cost of MOS TFT's employing the invention can be reduced without sacrificing any of the functional advantages of a single-crystal silicon active region.

FIGS. 3(A) to 3(E) show a sequence of process steps during fabrication of a C-MOS inverter according to present invention. In the preferred embodiment, the thin polycrystalline silicon layer is used to good effect in simplifying fabrication of the C-MOS inverter.

Figure 3A:
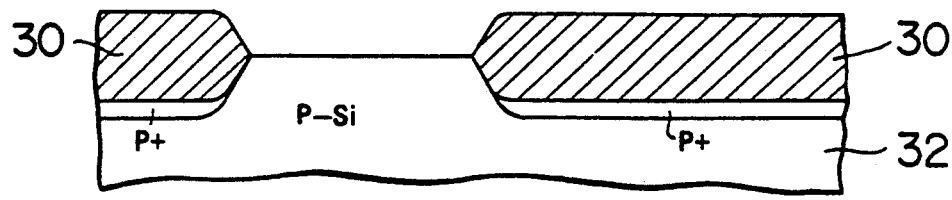
FIGS. 3(A) to 3(E) are cross-sections through a C-MOS inverter IC according to the present invention at five stages of its fabrication.

FIG. 3(A) shows the initial stage of fabrication of the C-MOS inverter according to the preferred method of the present invention. Field $SiO_2$ layers 30 are formed on a P-type Si substrate 32 by localized oxidation of silicon (LOCOS). LOCOS is carried out over most of the substrate 32, excluding only the section on which a MOS transistor is to be formed. Thereafter, a layer 36 of polysilicon or amorphous silicon is deposited over the entire surface by chemical vapor deposition.

Figure 3B:
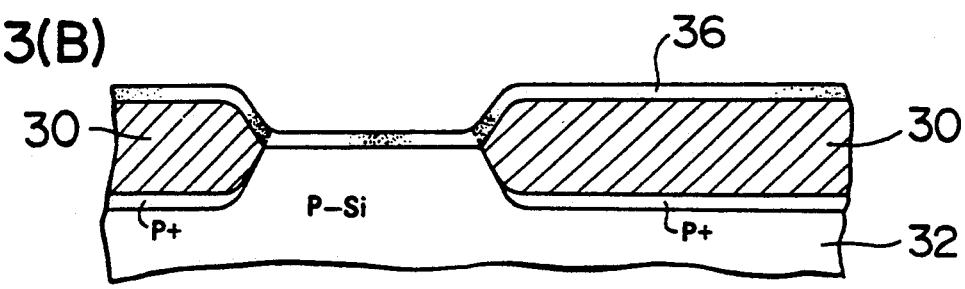

If desired, $Si^+$ or $Ge^+$ ion implantation and annealing for 15 hours at a temperature of 600° C. may follow deposition of polycrystalline silicon or amorphous silicon in the step shown in FIG. 3(B).

In the preferred embodiment, the thickness of the deposited polycrystalline silicon layer falls in the range of 20Å to 750Å, and preferably in the range of 200Å to 400Å. Holding the polysilicon layer to the preferred range of thickness ensures that the effective mobility will be adequately high and the leakage current will be acceptably low.

Figure 3C:
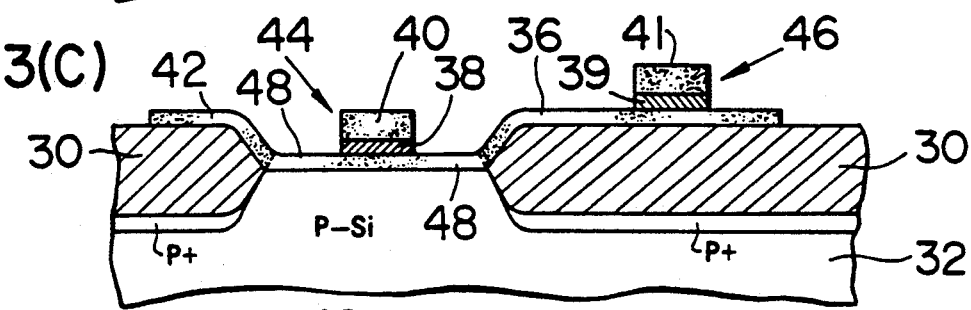

After performing the process shown in FIG. 3(B), the sections of the polycrystalline silicon layer formed on the field $SiO_2$ layer, appearing at the edges of FIG. 3(B), are removed, as shown in FIG. 3(C). Gate oxide layers 38 and 39 and gate electrodes 40 and 41 are formed at points on the polycrystalline silicon layer 36 at which an N-channel MOS drive transistor 44 and a P-type MOS load transistor 46 are to be formed.

Figure 3D:
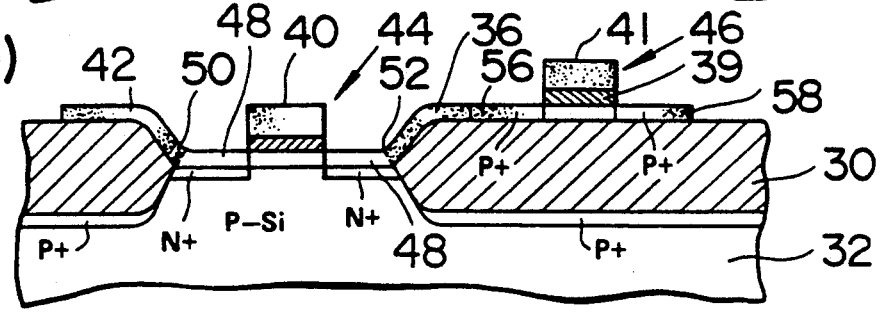
Figure 3E:
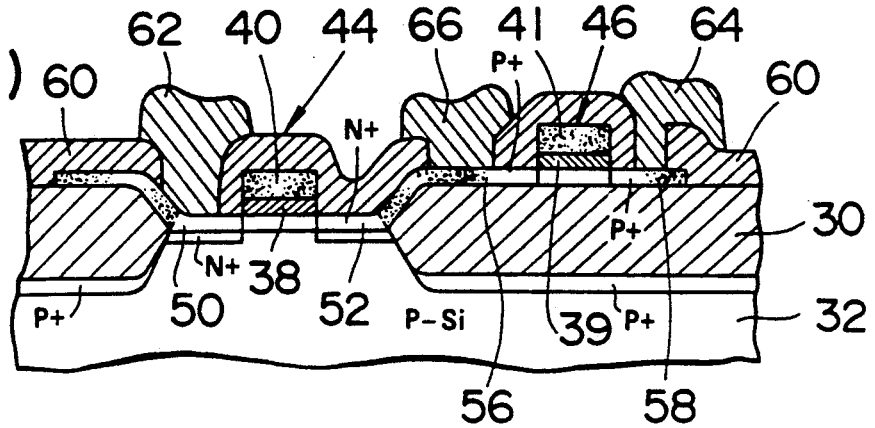

N-type ion implantation is performed on the section 48 of the polycrystalline silicon layer 42 on which the N-channel MOS drive transistor 44 is to be formed, as shown in FIG. 3(D). The resulting N+ regions to either side of the gate 40 serve as source region 50 and drain region 52 of the NMOS drive transistor 44. Similarly, P-type ion implantation is performed at the site of the P-channel MOS load transistor 46 to form its source region 56 and drain region 58. After this step, a relatively thick layer 60 of SiO$_2$ is deposited over the entire surface of the IC for insulation. Contact windows are etched through the oxide layer 60 through which a source electrode 62, a drain electrode 64 and a bridging electrode 66 which bridges between the drain region 52 of N-channel MOS drive transistor and the source region 56 of the P-channel MOS load transistor can contact the corresponding doped regions 50, 58, and 52/56, as shown in FIG. 3(E).

With the shown geometry, since the section of the polycrystalline silicon layer 42 directly below the gate oxide 38 is in direct contact with the single-crystal silicon substrate, the crystal grains of the vapor-deposited polysilicon layer 36 will tend to grow large enough to minimize the effect of carrier traps along grain boundaries. Furthermore, if an additional annealing step is added following the Si+ or Ge+ ion implantation process, the polysilicon layer may fully recrystallize into a single-crystal silicon layer. In either case, the source region and the drain region formed in the polycrystalline silicon layer will have a sufficiently high effective mobility.

According to the shown embodiment, the fabrication process for a C-MOS inverter can be significantly simplified. In particular, as set forth above, the polycrystalline silicon layer is deposited onto the areas of the substrate on which the N-channel MOS drive transistor and the P-channel MOS load transistor are to be formed prior to formation of the N-channel MOS drive transistor which is conventionally formed directly on the single-crystal silicon substrate. This allows both of the aforementioned transistors to be formed at the same time in a single step following vapor-deposition of the polycrystalline silicon layer, which has conventionally required at least two separate, independent steps. Furthermore, as the source regions and drain regions of the N-channel MOS drive transistor and P-channel MOS load transistor are formed in the same polycrystalline silicon layer, connection of the drain region of the N-channel MOS drive transistor to the source region of the P-channel MOS load transistor is greatly facilitated, in that the adjoining drain and source regions can be connected simply by means of the single bridging electrode. Additionally, since the gate electrodes for both of the transistors can be formed in a single step and at the same time, connecting the transistors to each other requires only a single phto-lithographic step and so obviates the need for the additional steps needed in fabrication of conventional transistors. Furthermore, since the source regions and drain regions may extend over wider areas than in conventional devices, the contact windows need not be as finely delineated, which further expedites the fabrication process.

Figure 4A:
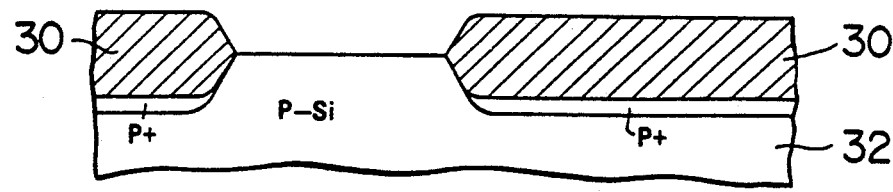
FIGS. 4(A) to 4(E) are cross-sections through a C-MOS inverter IC similar to FIGS. 3, showing a modification to the embodiment of FIGS. 3.
Figure 4B:
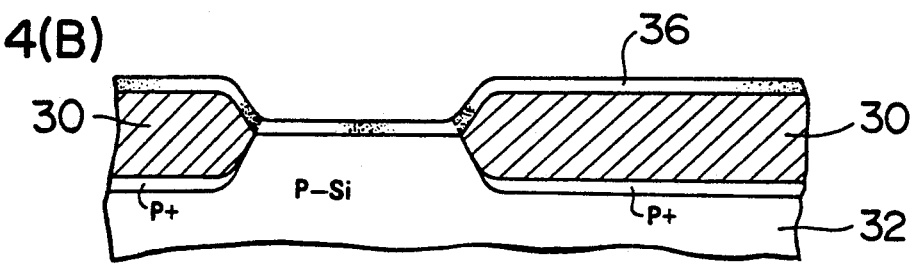
Figure 4C:
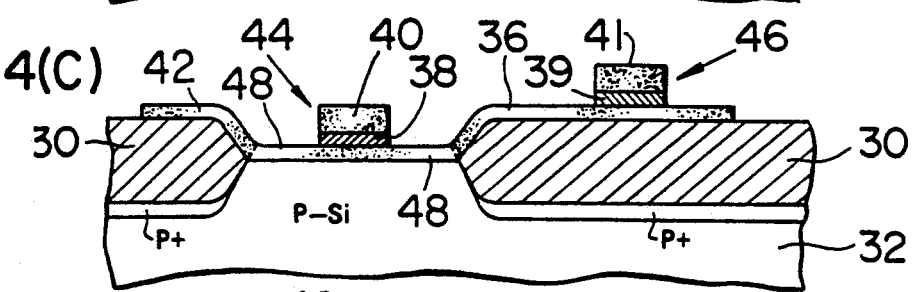
Figure 4D:
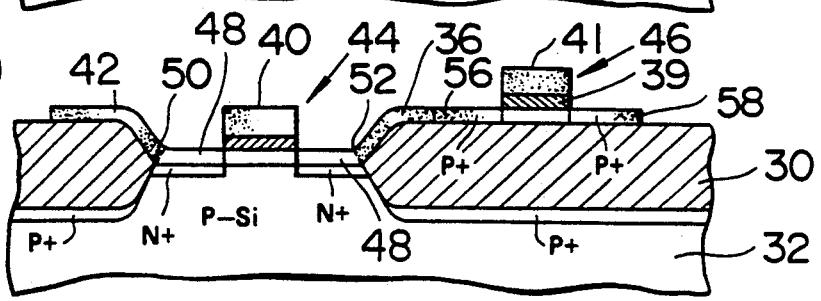
Figure 4E:
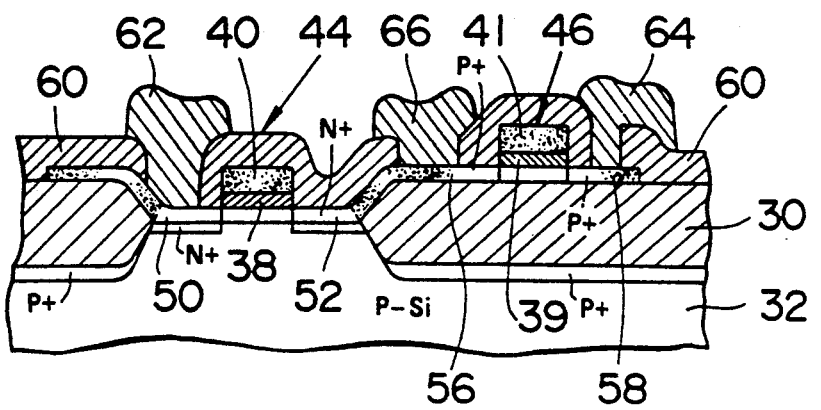

FIGS. 4(A) to 4(E) show essentially the same fabrication process for a C-MOS inverter as shown in FIGS. 3 but in this case the step illustrated in FIG. 4(B) includes the Si+ or Ge+ ion implantation and annealling steps mentioned previously. All of the steps other than that shown in FIG. 4(B) are substantially the same as described with reference to FIGS. 3(A) to 3(E).

In the modified process, Si+ or Ge+ ion implantation is performed following the step of depositing polycrystalline silicon or amorphous silicon on the P-type silicon substrate. Following ion implantation, annealing is performed for 15 hours at a temperature of approximately 600° C. This improves mobility characteristics of the polycrystalline silicon layer significantly. Specifically, the ion implantation and annealing steps increases the average polysilicon grain size in sections where the polysilicon layer is in contact with the single crystal layer to the point where the layer 36 may be traversed by single crystal grains, which makes the properties thereof essentially identical to single-crystal silicon.

Although the illustrated embodiment concerns an N-channel MOS transistor on a P-type substrate and a P-channel MOS transistor on a field SiO$_2$ layer, it would be possible to form a P-channel MOS transistor on an N-type silicon substrate and an N-channel MOS transistor on the field SiO$_2$ layer.

As set forth above, in accordance with the present invention, all of the objects and advantages are successfully achieved.

It should be appreciated that the present invention can be embodied in many ways the specific embodiments disclosed are to be regarded as mere examples for facilitating full understanding of the principle of the invention. Therefore, the invention should be understood as to include all possible embodiments within the principle set out in the appended claims.

What is claimed is:

1. A process for fabricating a field effect transistor having a glass substrate, a thin polycrystalline silicon film formed on said glass substrate, a gate electrode formed on said polycrystalline silicon film over an insulating layer, and input/output terminals connected to a source region and a drain region formed in said polycrystalline silicon film, said process comprising the steps of:
   depositing polycrystalline silicon on said substrate to a thickness in the range of 100Å to 750Å; and
   forming said gate electrode and input/output terminals subsequent to formation of said polycrystalline silicon film.

2. The process as set forth in claim 1, wherein said step of depositing said polycrystalline silicon film is performed by forming a film at a thickness greater than desired of the finished transistor and then exposing the film to thermal oxidation until the film is reduced to the desired thickness.

3. The process as set forth in claim 1, wherein the range of thickness of said film is 100Å to 600Å.

4. The process as set forth in claim 3, wherein the range of thickness of said layer is 200Å to 500Å.

5. The process as set forth in claim 1, wherein said substrate is quartz.

6. The process as set forth in claim 1, further comprising the step of forming said source region and said drain region in a spaced relationship in said polycrystalline silicon film, the region between said source region and said drain region defining an active region in said polycrystalline silicon film.

7. The process as set forth in claim 6, further comprising the step of forming said input/output electrodes on said source region and said drain region.

8. A process for producing an IC chip including a plurality of MOS transistors, comprising the steps of:
   forming an insulating layer over a glass substrate, said insulating layer leaving a section of said substrate exposed;
   depositing a polycrystalline silicon layer in a thickness of 100 to 750 Angstroms over said insulating layer and said exposed section;

forming said MOS transistors in said polycrystalline silicon layer over said insulating layer and said exposed section; and forming input/output terminals providing external connections to and from the MOS transistors and connecting electrodes which connect said MOS transistors to each other.

9. The process as set forth in claim 8, in which steps of performing ion implantation of an element selected from the group consisting of carbon, silicon, germanium, tin and lead into said polycrystalline silicon layer and of annealing said polycrystalline silicon layer follow said step of depositing said polycrystalline silicon layer.

10. The process as set forth in claim 8, wherein said MOS transistors are formed in a common process step.

11. The process as set forth in claim 8, wherein said input/output terminals and connecting electrodes are formed with the aid of a single photo-lithographic step.

12. The process as set forth in claim 8, wherein said substrate is quartz.

13. The process as set forth in claim 8, wherein the range of thickness of said layer is 100Å to 600Å.

14. The process as set forth in claim 13, wherein the range of thickness of said layer is 200Å to 500Å.

15. The process as set forth in claim 8, wherein said MOS transistors comprise an N-MOS and a P-MOS, said N-MOS being formed in said polycrystalline silicon layer over said exposed section and said P-MOS being formed in said polycrystalline silicon layer over said insulating layer.

16. A process for fabricating a field effect transistor having a quartz substrate, a thin polycrystalline silicon film formed on said quartz substrate, a gate electrode formed on said polycrystalline silicon film over an insulating layer, and input/output terminals connected to a source region and a drain region formed in said polycrystalline silicon film, said process comprising the steps of:

forming said polycrystalline silicon film on said quartz substrate to a thickness in the range of 100Å to 750Å;

forming said source region and said drain region in a spaced relationship in said polycrystalline silicon film, the region between said source region and said drain region defining an active region in said polycrystalline silicon film;

forming said insulating layer over said active region; and forming said gate electrode on said insulating layer and input/output terminals on said source and drain regions.

17. The process as set forth in claim 16, wherein said step of forming said polycrystalline silicon film is performed by forming a film at a thickness greater than that desired for the finished transistor and then exposing the film to thermal oxidation until the film is reduced to the desired thickness.

18. The process as set forth in claim 16, wherein the range of thickness of said film is 100Å to 600Å.

19. The process as set forth in claim 18, wherein the range of thickness of said film is 200Å to 500Å.

20. A process for producing an IC chip including a plurality of MOS transistors, comprising the steps of:

forming an insulating layer over a glass substrate, said insulating layer leaving a section of said glass substrate exposed;

depositing a polycrystalline silicon layer over said insulating layer and said exposed section to a thickness of 100 to 750 Angstroms;

performing ion implantation of an element selected from the group consisting of carbon, silicon, germanium, tin and lead into said polycrystalline silicon layer;

annealing said polycrystalline silicon layer;

forming said MOS transistors in a common process step on said polycrystalline silicon layer over said insulating layer and said exposed section; and forming input/output terminals providing external connections to and from said MOS transistors and connecting electrodes which connect said MOS transistors to each other.

* * * * *